(12) United States Patent
Li et al.

(10) Patent No.: US 9,698,783 B2
(45) Date of Patent: Jul. 4, 2017

(54) DRIVER INTEGRATED CIRCUIT

(75) Inventors: Wen Li, Tokyo (JP); Norio Chujo, Tokyo (JP); Masami Makuuchi, Tokyo (JP); Takehito Kamimura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 86 days.

(21) Appl. No.: 14/122,623

(22) PCT Filed: May 24, 2012

(86) PCT No.: PCT/JP2012/063297
§ 371 (c)(1),
(2), (4) Date: Jan. 14, 2014

(87) PCT Pub. No.: WO2012/165285
PCT Pub. Date: Dec. 6, 2012

(65) Prior Publication Data
US 2014/0125398 A1 May 8, 2014

(30) Foreign Application Priority Data
May 27, 2011 (JP) ................................ 2011-119185

(51) Int. Cl.
*H03K 19/0175* (2006.01)
*H03F 1/52* (2006.01)
(Continued)

(52) U.S. Cl.
CPC ........... *H03K 19/0175* (2013.01); *H03F 1/52* (2013.01); *H03F 3/195* (2013.01); *H03F 3/211* (2013.01);
(Continued)

(58) Field of Classification Search
CPC ........ H03K 19/0175; H03K 19/017509; H03F 1/52; H03F 3/3022; H03F 3/211; H03F 3/195
See application file for complete search history.

(56) References Cited

U.S. PATENT DOCUMENTS 6,014,054 A      1/2000  Kawakita et al.
7,149,088 B2 *  12/2006  Lin ....................... H05K 7/209
                                                                257/707
(Continued)

FOREIGN PATENT DOCUMENTS

JP          62-123826 A      6/1987
JP           11-41040 A      2/1999
(Continued)

OTHER PUBLICATIONS

International Search Report dated Aug. 7, 2012 with English translation (three (3) pages).
(Continued)

*Primary Examiner* — Lincoln Donovan
*Assistant Examiner* — Colleen O Toole
(74) *Attorney, Agent, or Firm* — Crowell & Moring LLP (57) ABSTRACT

Provided is a configuration of a driver integrated circuit that can output a voltage exceeding the withstand voltage of a process, and that satisfies required apparatus performance (high speed and high voltage). A differential input circuit, a level shift circuit, and an output circuit are manufactured by the same process and divided and disposed on three or more chips with different substrate potentials (sub-potentials). By setting different applied voltages to the substrates of the chips, an output voltage greater than the process withstand voltage can be provided (see FIG. 2).

7 Claims, 6 Drawing Sheets

(51) Int. Cl.
    *H03F 3/195*    (2006.01)
    *H03F 3/21*     (2006.01)
    *H03F 3/30*     (2006.01)

(52) U.S. Cl.
    CPC ... *H03F 3/3022* (2013.01); *H03K 19/017509* (2013.01); *H01L 2224/48137* (2013.01); *H01L 2924/181* (2013.01); *H03F 2200/189* (2013.01)

(56) References Cited

U.S. PATENT DOCUMENTS

| | | |
|---|---|---|
| 7,206,239 B2 | 4/2007 | Kikuchi et al. |
| 7,436,070 B2 | 10/2008 | Uno et al. |
| 7,973,405 B2 * | 7/2011 | Takahashi ............... H01L 24/49 |
| | | 257/690 |
| 8,018,268 B1 * | 9/2011 | Williams ........... H03K 17/0822 |
| | | 326/83 |
| 8,063,808 B2 | 11/2011 | Yamazaki et al. |
| 2010/0327878 A1 | 12/2010 | Ishikawa et al. |

FOREIGN PATENT DOCUMENTS

| | | |
|---|---|---|
| JP | 2006-275616 A | 10/2006 |
| JP | 2007-209036 A | 8/2007 |
| JP | 2009-88716 A | 4/2009 |
| JP | 4565879 B2 | 10/2010 |
| JP | 2011-7611 A | 1/2011 |

OTHER PUBLICATIONS

Japanese-language Written Opinion (PCT/ISA/237) dated Aug. 7, 2012 (four (4) pages).

\* cited by examiner

DRIVER INTEGRATED CIRCUIT

TECHNICAL FIELD

The present invention relates to a driver integrated circuit, such as a driver integrated circuit of high withstand voltage.

BACKGROUND ART

High-speed and high-voltage driver integrated circuits are widely used in various fields, such as semiconductor inspecting and measuring equipment and medical equipment. For example, semiconductor inspecting and measuring equipment includes an apparatus that irradiates a wafer as the object of measurement or inspection with an electron beam in a scanning motion, generates a measurement or detection image from generated secondary electrons, and performs measurement or inspection based on the measurement or detection image. When a semiconductor apparatus is inspected by using such semiconductor inspecting and measuring equipment, semiconductor wafer pattern measurement and inspection is performed at the end of each manufacturing step so as to detect abnormality or failure in the manufacturing process early or beforehand. For example, in the case of defect inspection, images of similar circuit patterns are compared, and a location with a large difference is judged to be a defect. In the case of a pattern measuring apparatus, because the amount of the generated secondary electrons varies depending on the profile of the sample, a change in the sample surface shape can be captured by evaluating a secondary electrons signal. In particular, based on a sharp increase in the secondary electrons signal at the pattern edge portion, the edge position in a semiconductor circuit pattern SEM image is estimated, and size measurement is performed.

In the semiconductor inspecting and measuring equipment as described above, an electron beam deflecting circuit for controlling the electron beam scan performs electron beam deflection control by applying a deflecting voltage of tens of V to hundreds of V to a deflection plate, in order to deflect the electron beam, which is accelerated by a voltage on the order of several kV to tens of kV, to a designated inspection or measurement position. Particularly, in order to increase the sensitivity and speed of the inspecting or measuring apparatus, a high-speed and high-voltage deflecting voltage is required. Further, in order to obtain a high deflecting voltage, a circuit must be configured by using a high withstand voltage process, resulting in an increase in manufacturing cost.

Meanwhile, a technology for configuring a circuit without using a high withstand voltage process in a part of the circuit is disclosed in Patent Document 1. Specifically, in Patent Document 1, a class D amplifier is realized without using a high withstand voltage process anywhere with the exception of an output stage of the circuit.

PRIOR ART DOCUMENT

Patent Document

Patent Document 1: JP Patent Publication (Kokai) No. 2007-209036 A

SUMMARY OF INVENTION

Technical Problem

However, in Patent Document 1, while some of the circuit portions other than the output stage do not require the high withstand voltage process, the output stage circuit still requires the high withstand voltage process. When the circuit is considered as a whole, this is not a means by which a voltage exceeding the process withstand voltage can be outputted, and does not provide a fundamental solution from the viewpoint of reducing cost and streamlining the circuit manufacturing process.

Generally, there are two types of high-voltage output driver circuits. One is an integrated configuration, and the other is a discrete configuration. When a circuit is configured by integration, basically all of the circuit constituent elements are produced on the same chip, which is finally packaged as a single component. In this case, the maximum output voltage range of the circuit is determined by the withstand voltage of the chip manufacturing process. If the maximum output voltage required for higher apparatus performance cannot be satisfied by the withstand voltage of a current process, a higher withstand voltage process needs to be developed. However, the development of a new high withstand voltage process is not easy as it requires cost and time.

On the other hand, when a circuit is configured by discrete components, devices individually packaging respective circuit elements are used. If the voltage applied to the respective devices is lower than the withstand voltage of each device, there is no problem. Even a circuit capable of outputting a voltage exceeding the withstand voltage of each device can be implemented by dividing the maximum voltage of the circuit among the devices by creative circuit designing. However, when the circuit is configured by discrete components, the number of components and therefore the mounting area are increased, often making it difficult to achieve the required high-speed performance due to the influence of parasitic elements produced by the wiring between the individual packages or components.

The present invention was made in view of such circumstances, and provides a configuration of a driver integrated circuit that can be manufactured in a short period and at low cost by utilizing a current process, that can output a voltage exceeding a process withstand voltage, and that can satisfy required apparatus performance (high speed and high voltage).

Solution to Problem

In order to solve the above problem, a driver integrated circuit according to the present invention includes a differential input circuit that amplifies a differential input signal; a level shift circuit that shifts the voltage of the signal amplified by the differential input circuit; and an output circuit that amplifies and outputs the signal whose voltage is shifted by the level shift circuit. The differential input circuit, the level shift circuit, and the output circuit are divided by using three or more chips. Different voltages are applied to substrates of the three or chips so that the output circuit outputs an output voltage greater than a process withstand voltage.

These and other features of the present invention will become apparent after a review of the following detailed description in the specification when read in conjunction with the attached drawings. The modes of the present invention will be achieved and realized by elements and various combinations thereof particularly pointed out and recited in the following detailed description and the appended claims.

It is to be understood that the description in the present specification is exemplary and explanatory and is not restrictive of the invention as claimed or of applied examples.

Advantageous Effects of Invention

According to the present invention, the cost and time required for developing a new process can be saved, and a driver integrated circuit capable of outputting a voltage greater than a process withstand voltage can be realized.

DESCRIPTION OF EMBODIMENTS

In the following, embodiments of the present invention will be described with reference to the attached drawings. In the attached drawings, functionally identical elements may be designated with similar reference numerals. While the attached drawings illustrate specific embodiments and implementation examples in accordance with the principle of the present invention, these are intended for aiding an understanding of the present invention and are never to be used for interpreting the present invention in a limiting sense.

While the embodiments will be described with enough specific detail to enable those skilled in the art to practice the present invention, it should be understood that other implementations and modes are also possible, and that various modifications in configuration or structure and substitution of various elements may be made without departing from the technical scope and spirit of the present invention. Therefore, the following description is not to be taken as limiting the present invention.

(1) First Embodiment
<Configuration of General Driver Integrated Circuit>

Figure 1:
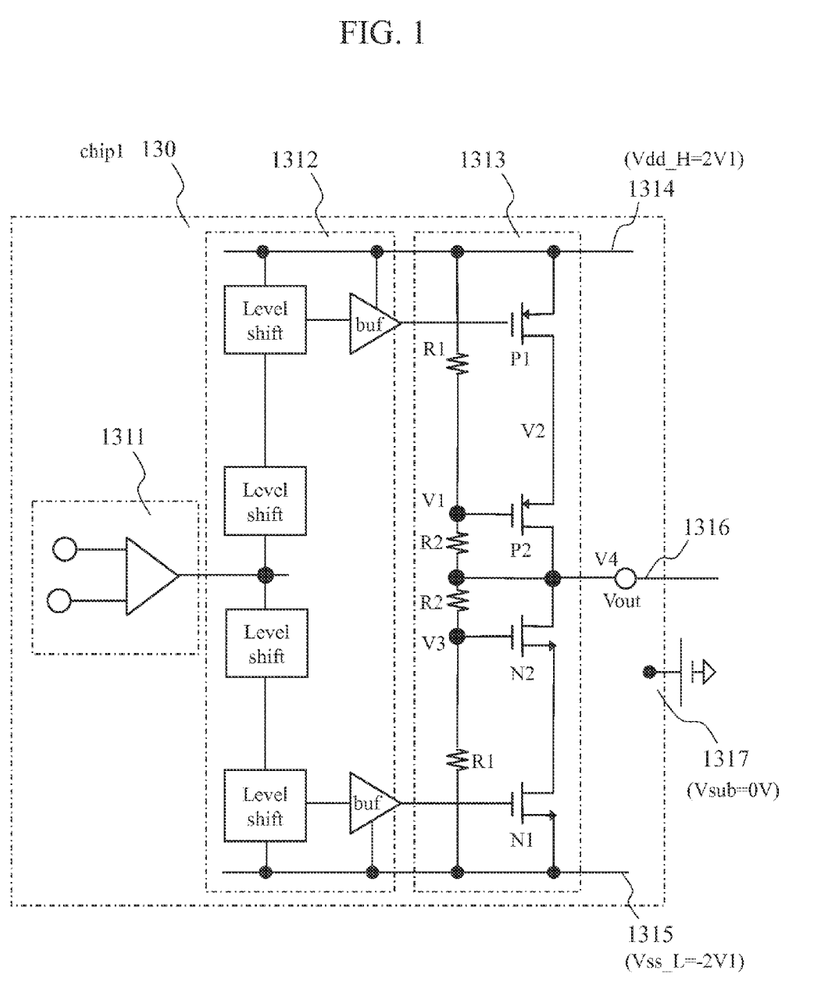
FIG. 1 illustrates a schematic configuration of a general driver integrated circuit.

FIG. 1 illustrates the configuration of a general high-voltage output driver integrated circuit. The high-voltage output driver integrated circuit 130 generally includes a differential input circuit 1311, a level shift circuit 1312, and a high-voltage output stage circuit 1313. When the output voltage of a high-voltage output terminal 1316 is set at ±Vo, and the maximum applied voltage to the circuit is ±V1, V1 needs to be set at a voltage (dropped voltage of device) higher than Vo by several V to several tens of V.

When the circuit illustrated in FIG. 1 is integrated by an existing process method, the range of voltages simultaneously applied to the chip is a maximum of ±2V1, and the required process withstand voltage is ±2V2, where V2=V1+δV1, δV1 being a margin.

<Configuration of Improved High Withstand-Voltage Driver Integrated Circuit>

Figure 2:
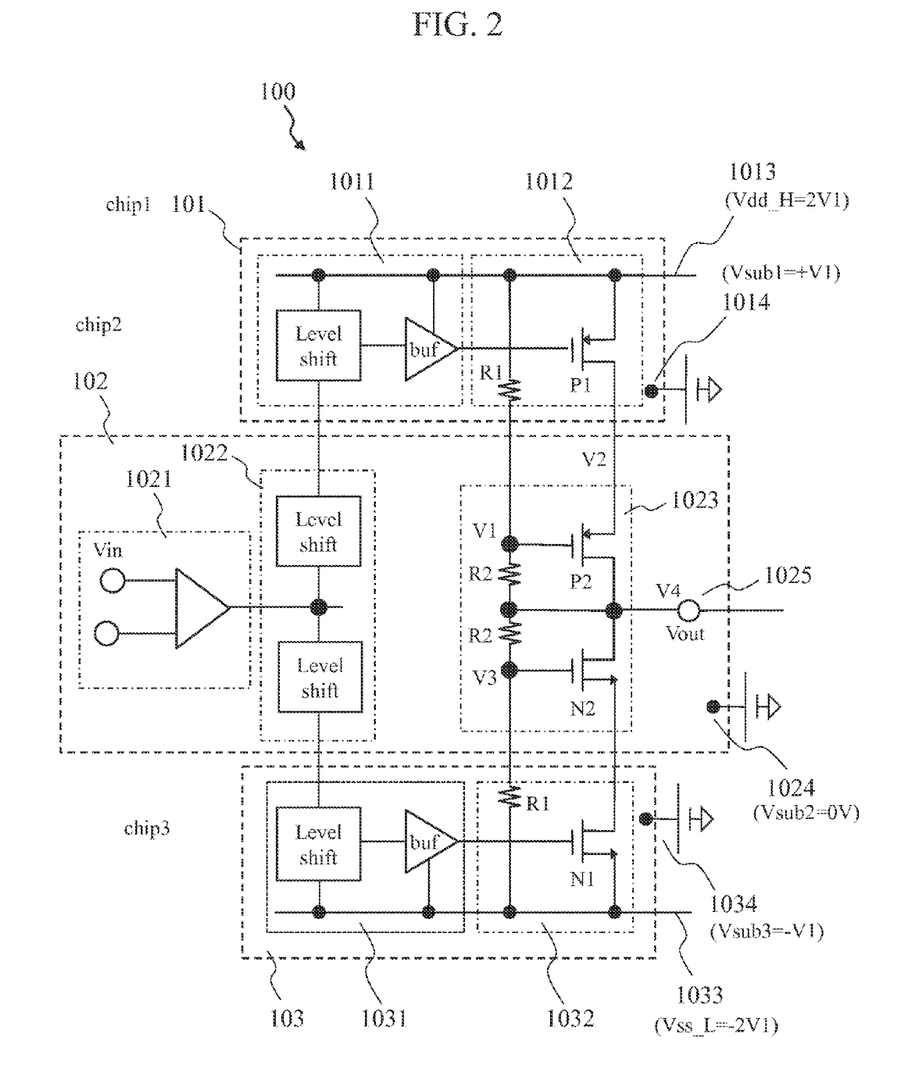
FIG. 2 illustrates a schematic configuration of a high withstand-voltage driver integrated circuit according to an embodiment of the present invention.

FIG. 2 illustrates a configuration of an improved high withstand-voltage driver integrated circuit according to the first embodiment of the present invention. By adopting the circuit configuration of FIG. 2, a maximum output voltage of ±2V1 can be obtained by using a process with a withstand voltage ±V2 (V1≈V2).

As illustrated in FIG. 2, in the high withstand-voltage driver integrated circuit 100, the overall driver circuit is divided into three chips 101, 102, and 103. The substrate potentials (reference voltages) of the individual chips are set at different potentials of Vsub1, Vsub2, and Vsub3. While the potentials of the Vsub1, Vsub2, and Vsub3 may be freely set, when the withstand voltages of the three divided chips 101, 102, and 103 are the same, Vsub1 and Vsub3 can be symmetrical with respect to Vsub2, such as Vsub1=V1, Vsub2=0, and Vsub3=−V1, whereby the withstand voltage of the circuit as a whole can be maximized. If there is a variation in the applied voltage, Vsub1=V±δ, Vsub2=±δ, and Vsub3=−V1±δ. Preferably, the chips may be manufactured by the same process.

A differential input circuit unit (differential input stage portion) 1021 is disposed on the chip 102, with an applied voltage range set lower than the process withstand voltage.

The range of voltage applied to a level shift circuit unit (level shift stage portion) is ±2V1 at a maximum, which is almost twice the process withstand voltage ±V2. The level shift stage portion is separated into the three chips, i.e., a chip 1_101, a chip 2_102, and a chip 3_103. The circuit belonging to the level shift stage portion includes a high-voltage portion 1011, an intermediate-voltage portion 1022, and a low-voltage portion 1031. An applied voltage $V_{LS\_H}$ to the high-voltage portion 1011 disposed in the chip 1_101 is set in a range (applied voltage range) of $V1<V_{LS\_h}<2V1$. An applied voltage $V_{LS\_M}$ to the intermediate-voltage portion 1022 disposed in the chip 2_102 is set in a range (applied voltage range) of $-V1<V_{LS\_m}<V1$. An applied voltage $V_{LS\_L}$ to the low-voltage portion 1031 disposed in the chip 3_103 is set in a range (applied voltage range) of $-2V1<V_{LS\_l}<-V1$.

Similarly, the high-voltage output circuit unit is also distributed among the three chips. Namely, the circuit belonging to the high-voltage output circuit portion includes a high-voltage portion 1012, an intermediate-voltage portion 1023, and a low-voltage portion 1032. An applied voltage $V_{HVO\_H}$ to the high-voltage portion 1012 disposed in the chip 1_101 is set in a range (applied voltage range) of $V1<V_{HVO\_H}<2V1$. An applied voltage $V_{HVO\_M}$ to the intermediate-voltage portion 1023 disposed in the chip 2_102 is set in a range (applied voltage range) of $-V1<V_{HVO\_M}<V1$. An applied voltage $V_{HVO\_L}$ to the low-voltage portion 1032 disposed in the chip 3_103 is set in a range (applied voltage range) of $-2V1<V_{HVO\_L}<-V1$.

In the high withstand-voltage driver integrated circuit 100 illustrated in FIG. 2, a differential input signal Vin is amplified by a differential input portion (differential input amplifier) 1021. The amplified signal has its voltage shifted by a level shift portion (level shifter circuit) 1022 for a H-level side gate input and a L-level side gate input. The voltage-shifted signal is amplified and outputted by a final-stage driver (an intermediate-voltage portion 1023 of the high-voltage output stage) including transistors (P1, P2, N1, N2) and resistors (R1, R2). In the final-stage driver, PMOSs (P1, P2) and NMOSs (N1, N2) are connected in cascade arrangement. A gate voltage V3 of N2 and a gate voltage V1 of P2 can be expressed as follows by expressions (1) and (2).

[Formula 1]

$$V1 = \frac{R2}{R1+R2}(\text{Vdd\_H} - Vout) + Vout \qquad (1)$$

$$V3 = \frac{R2}{R1+R2}(Vout - \text{Vss\_L}) + \text{Vss\_L} \qquad (2)$$

The source voltages (V2 and V4) of P2 and N2 can be expressed by expressions (3) and (4), respectively.

[Formula 2]

$$V2 = \frac{R2}{R1+R2}(\text{Vdd\_H} - Vout) + Vout - \text{Vgs\_p} \qquad (3)$$

$$V4 = \frac{R2}{R1+R2}(Vout - \text{Vss\_L}) + \text{Vss\_L} - \text{Vgs\_n} \qquad (4)$$

where $V_{gs\_p}$ is the gate-source voltage of P2, and $V_{gs\_n}$ is the gate-source voltage of N2.

From expression (4), when V4 is set at (Vout−Vss_L)/2, the drain-source voltage of the NMOSs and PMOSs is equally divided for a maximum high withstand voltage. Thus, R1 and R2 can be expressed by expression (5).

[Formula 3]

$$R2 = R1\frac{Vout - \text{Vss\_L} + 2\text{Vgs\_n}}{Vout - \text{Vss\_L} - 2\text{Vgs\_n}} \qquad (5)$$

By thus employing the divided chips and through resistive voltage division, the applied voltage to the device on each chip can be ensured to be not more than the process withstand voltage, and also the voltage applied to the circuit as a whole and the maximum output voltage can be made approximately greater than the process withstand voltage (such as by a factor of two).

<Mounting Structure>

Figure 3:
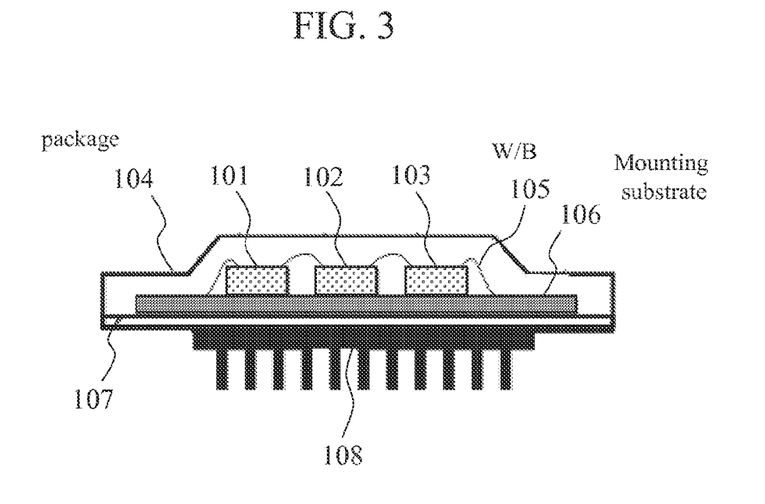
FIG. 3 is a schematic view of a hybrid package of the high withstand-voltage driver integrated circuit.
Figure 4:
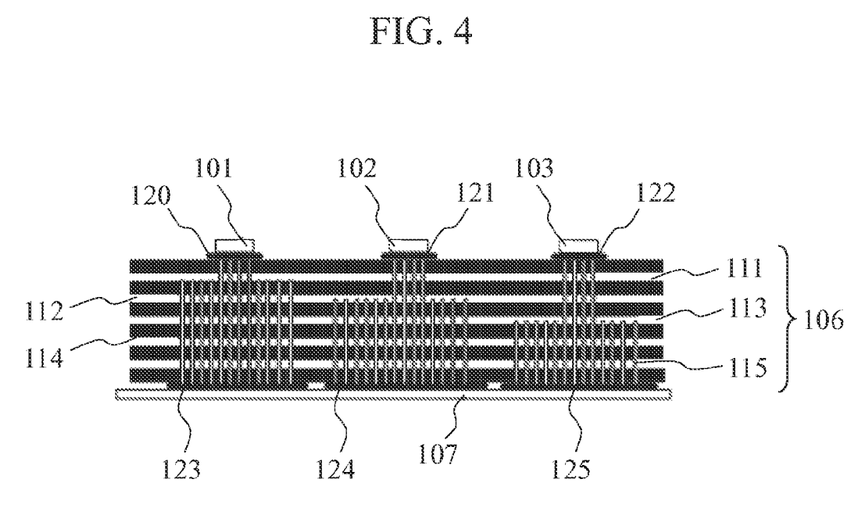
FIG. 4 is a cross sectional view of a heat-dissipating mounting substrate of the high withstand-voltage driver integrated circuit, and its pattern.

With reference to FIGS. 3 and 4, a mounting structure of the high withstand-voltage driver integrated circuit will be described. Here, chip-to-chip wiring and packaging required for enabling the circuit divided by the three chips to operate as a single circuit will be described. FIG. 3 illustrates a hybrid package configuration for implementing the three chips in one case. FIG. 4 illustrates a cross sectional structure of the high withstand-voltage driver integrated circuit mounted on a substrate.

In FIG. 3, the chips 101, 102, and 103 are disposed on the same mounting substrate 106, with electric signal transmissions between the chips implemented by a short wire bonding 105 connected such that parasitic elements produced by wiring can be minimized. In this way, a hybrid integrated circuit capable of providing a high-speed and high-voltage output can be realized.

One major issue of a high-voltage output circuit is heat dissipation. For example, a high-voltage output circuit fed at ±200 V with a maximum output current of 150 mA consumes approximately 30 W of power, thereby generating heat. The heat may cause circuit malfunctioning. Thus, heat dissipation design is an important issue for normal circuit operation.

The heat from the chips basically escapes from the substrate 106 into the air via the package 104. Namely, the basic heat dissipation path is the substrate→package→air. However, in order to increase heat dissipation efficiency, this heat dissipation path is not sufficient. Thus, in order to improve the heat dissipation efficiency of the package, generally a heat dissipator (heat sink) 108 is fitted to the package 104. Many of the packages and heat dissipators are basically made of metal.

With reference to FIG. 4, a cross sectional structure of the circuit will be described. In the circuit, the potential on the rear surface of each chip that is the major area for heat dissipation, and the connecting pattern potential of the mounting substrate 106 are the same as the sub-potential (substrate potential) of each chip. When the chips 101 to 103 are connected on the substrate 106, separate patterns 120, 121, and 122 are disposed on a surface (chip mounting surface) of the substrate 106, and the chips are mounted on the separate patterns.

According to the present embodiment, in order to facilitate the conduction of the heat from the chips to the rear surface of the substrate 106 via the patterns 120, 121, and 122, the substrate 106 has a multilayer structure. As illustrated in FIG. 4, the multilayer substrate structure includes a heat dissipation solid layer 111 for the chip 1, a heat dissipation solid layer 112 for the chip 2, a heat dissipation solid layer 113 for the chip 3, and a solid layer 114 as a circuit ground layer. On the rear surface of the substrate 106, rear surface patterns (which may be referred to as "equipotential heat dissipation patterns" or "chip potential patterns") 123, 124, and 125 with the sub-potentials of the chips 101 to 103 are disposed. The potential of the same solid layer is set at the same potential. For example, the heat-dissipating solid layer 111 for the chip 1 is set at V1, the heat-dissipating solid layer 112 for the chip 2 is set at 0V, and the heat-dissipating solid layer 113 for the chip 3 is set at −V1. In this sense, the heat-dissipating solid layer 111 for the chip 1 may be referred to as a sub-potential solid pattern layer of the chip 1, the heat-dissipating solid layer 112 for the chip 2 may be referred to as a sub-potential solid pattern layer of the chip 2, and the heat-dissipating solid layer 113 for the chip 3 may be referred to as a sub-potential solid pattern layer of the chip 3.

Further, in order to decrease the thermal resistance between the sub-potential pattern 120 of the chip 1_101, the solid layer 111, and the rear surface pattern 123, as many vias (which may be referred to as "connecting vias" or "wire bonding") 115 as possible may be disposed. Similarly, in order to decrease the thermal resistance between the sub-potential pattern 121 of the chip 2_102, the solid layer 112, and the rear surface pattern 124, and the thermal resistance between the sub-potential pattern 122 of the chip 3_103, the solid layer 113, and the rear surface pattern 125, a number of vias (connecting vias) 115 are disposed. It should be noted that the vias provided for each chip are disposed in such a manner as to be not electrically connected to other chips.

Because there are wirings on the surface of the chips 101 to 103, the heat cannot easily escape to the package 104. Thus, when the above-described configuration is adopted, the major heat dissipation path from the chips to the package is the chips 101 to 103→the potential patterns 120 to 122→and the rear surface patterns 123 to 125.

However, the chips have different sub-pattern potentials, so that the chips cannot be directly connected to the same package. Thus, an insulating sheet or cream 107 is required between the rear surface of the substrate 106 and the package 104. The insulating sheet or cream needs to satisfy at least the two conditions of high withstand voltage insulating property (possession of electrical insulating property), and low thermal resistance (ease of thermal escape).

By the implementation and the heat-dissipating structure described above, a normal operation of the high withstand-voltage driver integrated circuit according to the embodiments (the first to the third embodiments) of the present invention can be ensured.

(2) Second Embodiment

Figure 5:
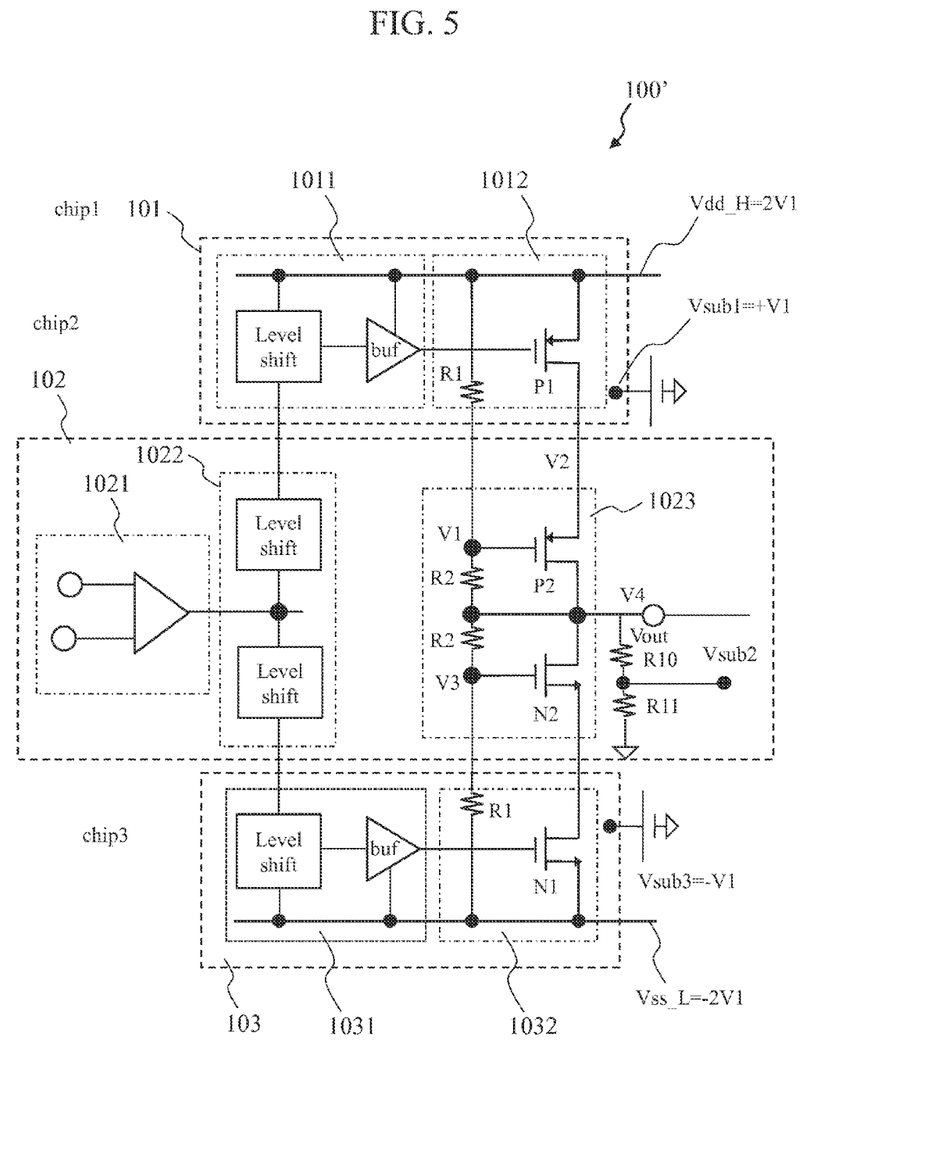
FIG. 5 illustrates a schematic configuration of the high withstand-voltage driver integrated circuit according to a second embodiment.

FIG. 5 illustrates a configuration of the high withstand-voltage driver integrated circuit according to the second embodiment of the present invention. The second embodiment is basically similar to the first embodiment in circuit configuration and heat dissipation design. Thus, the following description is only concerned with differences.

As illustrated in FIG. 5, the sub-potential Vsub2 of the chip 102 at the center of a high withstand-voltage driver integrated circuit 100' is not a fixed potential (Vsub2=0) as in the first embodiment but a potential obtained by dividing the output Vout by resistors R10 and R11, as expressed by expressions (6) and (7).

[Formula 4]

$$Vsub2 = \frac{R11}{R10 + R11} Vout \quad (6)$$

$$Vout - Vsub2 = \frac{R10}{R10 + R11} Vout \quad (7)$$

Thus, the maximum voltage applied to the chip 102 is ±Vout. When a withstand voltage condition is considered, it is basically required that |Vout−Vsub2|<process withstand voltage. When the positive and negative voltage ranges of Vout are the same, 0 V will be the most advantageous if Vsub2 is a fixed potential. At this time, the withstand voltage condition is Vout<process withstand voltage.

As illustrated in FIG. 5, by adopting the setting such that Vsub2 is varied in accordance with Vout according to expressions (6) and (7), the value of Vout−Vsub2 can be decreased by the selection of R10 and R11. In view of the presence of ground potential on the chip 102, when a setting R10=R11 is made, the maximum potential difference with respect to the sub-potential on the chip 102 is Vout/2. Namely, the withstand voltage condition of the chip 102 can be reduced in half.

Further, by increasing the number of the voltage dividing resistors and the transistors of the output stage circuit, a driver circuit that can output a voltage twice or more of the process withstand voltage can be designed and manufactured.

(3) Third Embodiment (Expanded Version)

Figure 6:
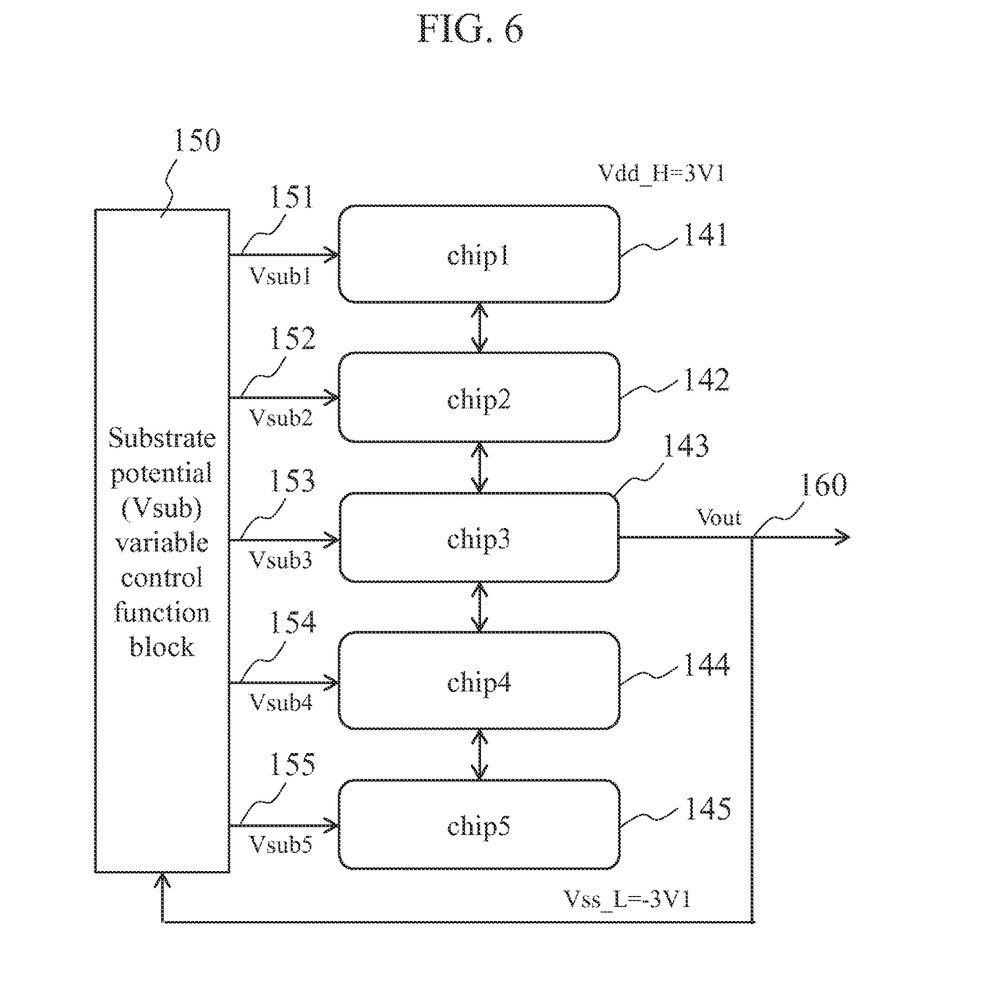
FIG. 6 illustrates a schematic configuration of the high withstand-voltage driver integrated circuit according to a third embodiment.

FIG. 6 illustrates a configuration of the high withstand-voltage driver integrated circuit according to the third embodiment of the present invention. The present embodiment is substantially similar to the first and the second embodiments in the basic configuration of the high withstand-voltage driver integrated circuit. Thus, the following description only concerns differences from the first and the second embodiments while omitting description of redundant portions.

As described above, the first and the second embodiments have been described with reference to the example using three chips when the portion for series connection of high applied voltages is divided into chips. According to the present embodiment, the circuit may be divided into five chips 141 to 145. When the five-chip configuration is used, a substrate potential variable control functional block 150 automatically and variably controls all of chip sub-potentials 151 to 155 in accordance with an output voltage 160 from the integrated circuit as a whole. For example, let the maximum output voltage of the system be ±3V1, the applied voltage to the chip 141 be 3V1, and the applied voltage to the chip 145 be −3V1. When the output voltage Vout is approximately equal to −3V1, the applied voltage range of each of the chips 141 to 143 can be the range of ±V1 with respect to the sub-potential by setting the sub-potential of the chip 141 at 2V1, the sub-potential of the chip 142 at 0V, and the sub-potential of the chip 143 at −2V1. Similarly, when the output voltage Vout=3V1, the applied voltage range of each of the chips 145 to 143 can be the range of ±V1 with respect to the sub-potential by setting the sub-potential of the chip 145 at −2V1, the sub-potential of the chip 144 at 0V, and the sub-potential of the chip 143 at 2V1. In this way, the circuit as a whole can output a high voltage of up to three times the process withstand voltage. As in the first embodiment, the respective chips may preferably be manufactured by the same process.

Figure 7:
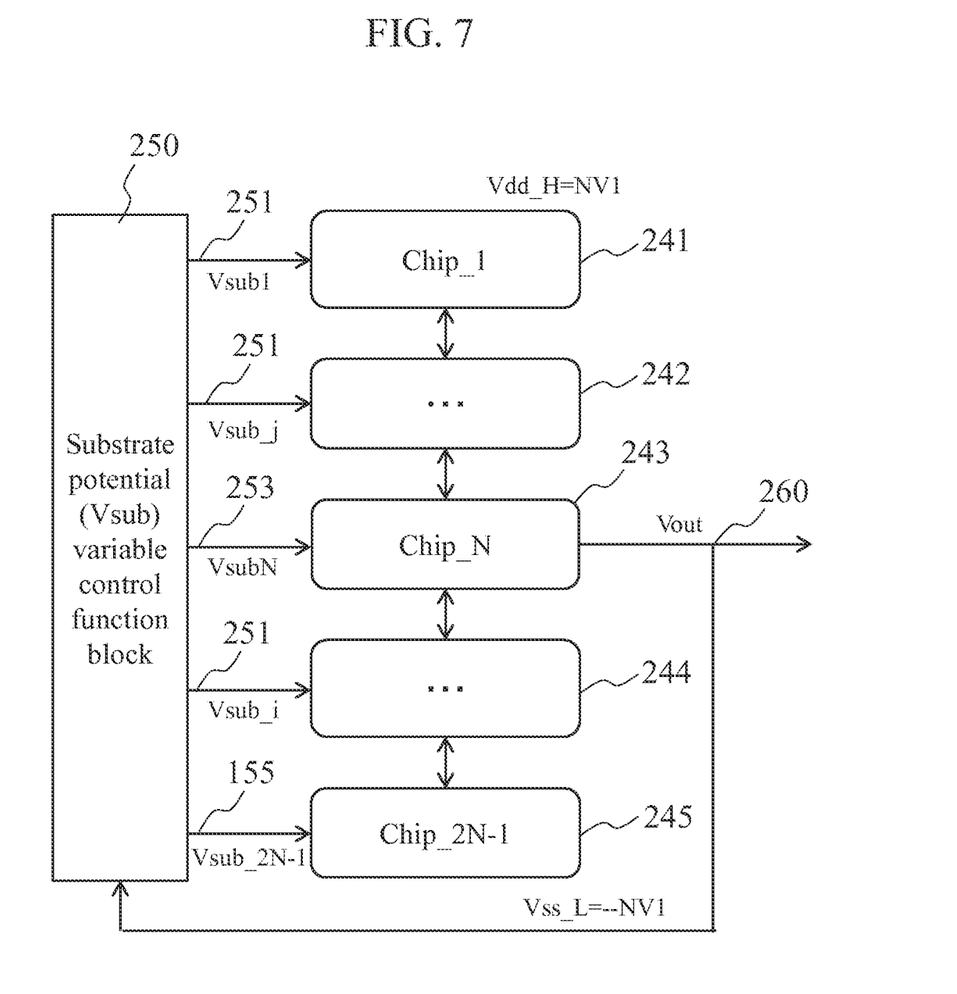
FIG. 7 illustrates a generalized schematic configuration of the high withstand-voltage driver integrated circuit according to the third embodiment.

According to a generalization of the present embodiment, the circuit may be divided into five or more chips, as illustrated in FIG. 7. In this case, in a (2N−1) chip division configuration with the withstand voltage of ±V1, a high voltage of ±NV1 at a maximum can be outputted.

(4) Summary

A driver integrated circuit is configured of three basic functional blocks including a differential input unit, a level shift unit, and a high-voltage output unit (output circuit unit) for driving a load. While the voltage level regarding the differential input unit is basically a low voltage, the voltages regarding the level shift unit and the output unit circuit are at levels substantially close to the maximum output voltage of the circuit. In order to decrease the applied voltage range of the components used in the level shift unit and the output unit, the level shift unit and the output circuit unit are divided into three series-connected blocks, and the range of voltage applied to each block is limited to the process withstand voltage range. For example, a case is considered in which a driver circuit with the maximum output voltage of about ±2V1 is made by using a process of which the withstand voltage, including a margin δV, is ±V1 (actual process withstand voltage V2=V1+δV1, where δV1 is margin). The three chips 1, 2, and 3 are made by using the same process, and the substrate potential of each chip is set at different potentials of Vsub1=V1 (±variation component), Vsub2=0 (±variation component), and Vsub3=−V1 (±variation component). In this way, the driver integrated circuit is configured by using the current process, whereby the cost and time for developing a new process can be saved. Thus, a driver integrated circuit with the required high withstand voltage that can output a voltage higher than the process withstand voltage can be realized.

The differential input unit is disposed in the chip 2 with the substrate potential Vsub1=0. The level shift circuit is divided into three parts which are disposed on the chips 1 to 3 and are series-connected in accordance with the range of applied voltage. For example, in the level shift circuit, the portion (1011) where V1<applied voltage<2V1 is disposed on the chip 1 with Vsub1=V1, the portion (1022) where −V1<applied voltage range<V1 is disposed on the chip 2, and the portion (1031) where −2V1<applied voltage<−V1 is disposed on the chip 3.

Similarly, the output circuit is divided into three portions which are disposed on the chips 1 to 3 and series-connected. For example, in the output circuit, the portion (1012) where V1<applied voltage<2V1 is disposed on the chip 1 with Vsub1=V1, the portion (1023) where −V1<applied voltage range<V1 is disposed on the chip 2, and the portion (1032) where −2V1<applied voltage<−V1 is disposed on the chip 3. While the voltages applied to the chips 1, 2, and 3 have different absolute values, this is not a problem as long as the voltage range is within the withstand voltage range of each chip because the sub-potential (substrate potential) of each chip is floating (i.e., not connected to ground).

The applied voltage to the chip 2 may be set at a potential determined by resistive division of the output voltage. Thus, the applied voltage (sub-potential) to the chip 2 is automatically varied in accordance with the output voltage, whereby the withstand voltage condition for the chip 2 can be relaxed.

The three chips may be implemented in a single package and connected by wire bonding (vias) for short signal transmission between the chips. In this way, the parasitic element produced by wiring can be minimized, whereby a high-speed and high-voltage output hybrid IC can be realized.

The driver integrated circuit is configured on a multilayer substrate, with the heat dissipator mounted on the rear surface of the multilayer substrate (on the opposite side to the chip mounting surface). The heat from the chips is transmitted via the vias to the heat dissipator. In this way, the heat generated by the chips that does not easily escape via the package and that may cause malfunctioning can be efficiency dissipated, whereby circuit malfunctioning can be avoided. Preferably, between the rear surface of the multilayer substrate and the heat dissipator, an insulating layer of an insulating material (such as an insulating sheet or insulating cream) may be formed.

While embodiments of the present invention have been described in detail, the specific examples described in the specification are merely exemplary, and the scope and spirit of the present invention will be determined by the appended claims. Various modes can be formed by appropriate combinations of the constituent elements disclosed by the embodiments. Further, control lines and information lines that are illustrated in the foregoing embodiments are only those considered necessary for purposes of explanation, and do not necessarily represent all of the control lines or information lines required in a product. All of the configurations may be mutually connected. In addition, other implementations of the present invention will readily occur to those with ordinary skill in the art from consideration of the specification and the embodiments.

REFERENCE SIGNS LIST

101 Chip 1 (divided chip 1)
102 Chip 2 (divided chip 2)
103 Chip 3 (divided chip 3)
1011 Level shift circuit unit disposed on chip 1
1012 High-voltage output circuit unit disposed on chip 1
1013 Positive power supply of driver integrated circuit
1014 Sub-potential Vsub1 of chip 1 of driver integrated circuit
1021 Differential input circuit unit disposed on chip 2
1022 Level shift circuit unit disposed on chip 2
1023 High-voltage output circuit unit disposed on chip 2
1024 Sub-potential Vsub2 of chip 2 of driver integrated circuit
1025 Output terminal Vout of driver integrated circuit
1031 Level shift circuit unit disposed on chip 3
1032 High-voltage output circuit unit disposed on chip 3
1033 Negative power supply of driver integrated circuit
1034 Sub-potential Vsub3 of chip 3 of driver integrated circuit
1311 Differential input circuit unit of driver integrated circuit
1312 Level shift circuit unit of driver integrated circuit
1313 High-voltage output circuit unit of driver integrated circuit
1314 Positive power supply of driver integrated circuit
1315 Negative power supply of driver integrated circuit
1316 Output terminal of driver integrated circuit
1317 Chip sub-potential Vsub of driver integrated circuit
104 Hybrid package
105 Vias (connecting vias, wire bonding)
106 Mounting substrate (hybrid chip mounting substrate)
107 Insulating sheet (insulating sheet between hybrid chip mounting substrate and package)
108 Heat sink for hybrid IC in use
120, 121, 123 Chip potential pattern on mounting substrate surface
111 Heat-dissipating solid layer of chip 1 (sub-potential solid pattern layer of divided chip 1)
112 Heat-dissipating solid layer of chip 2 (sub-potential solid pattern layer of divided chip 2)
113 Heat-dissipating solid layer of chip 3 (sub-potential solid pattern layer of divided chip 3)
114 Circuit-grounding solid layer (ground potential solid pattern layer of circuit)
115 Connecting vias (connecting vias for divided chip patterns on mounting substrate surface, rear surface pattern, and solid layer)
123, 124, 125 Chip potential patterns on mounting substrate rear surface
130 Conventional circuit chip configuration
141, 142, 143, 144, 145 Chips (divided chips)
150 Substrate potential variable control unit
151, 152, 153, 154, 155 Sub-potential of each chip
160 Voltage output terminal of overall integrated circuit
241, 242, 243, 244, 245 Chips (divided chips)
250 Substrate potential variable control unit
251, 252, 253, 254, 255 Sub-potential of each chip
260 Voltage output terminal of overall integrated circuit

The invention claimed is:

1. A charged particle beam apparatus for measuring a wafer based on secondary electrons generated by irradiating an electron beam to the wafer, the charged particle beam apparatus comprising:
a differential input circuit that amplifies a differential input signal;
a level shift circuit that shifts the voltage of the signal amplified by the differential input circuit; and
an output circuit that amplifies and outputs the signal whose voltage is shifted by the level shift circuit,
wherein:
the level shift circuit and the output circuit are divided by using three or more chips;
different voltages are applied to substrates of the three or more chips;

a deviation control of the electron beam is performed with the signal amplified by the output circuit;

the three or more chips include a first chip as a high voltage-applied chip, a second chip as an intermediate voltage-applied chip, and a third chip as a low voltage-applied chip;

an applied voltage to the first chip is set at $V1\pm\delta$ ($V1$ is substantially equal to $V2$; $\delta$ is a variation factor), an applied voltage to the second chip is set at $0\pm\delta$, and an applied voltage to the third chip is set at $-V1\pm\delta$, where $V2$ is the process withstand voltage; and the output voltage from the output circuit has a maximum value of $\pm 2V1$.

2. The charged particle beam apparatus according to claim 1, wherein:

the differential input circuit is disposed on the second chip;

the level shift circuit is divided into portions disposed on the first to the third chips;

a level shift circuit portion of the first chip retains a H-level side signal generated by a level shift circuit portion of the second chip by shifting the voltage of the amplified signal;

a level shift circuit portion of the third chip retains a L-level side signal generated by the level shift circuit portion of the second chip by shifting the voltage of the amplified signal;

the output circuit is divided into portions disposed on the first to the third chips;

the H-level side signal is amplified by an output circuit portion of the first chip and an output circuit portion of the second chip;

the L-level side signal is amplified by the output portion of the second chip and an output circuit portion of the third chip; and the output voltage is generated from the amplified signals.

3. The charged particle beam apparatus according to claim 2, wherein:

an applied voltage to the level shift circuit portion of the first chip is set to be greater than $V1$ and smaller than $2V1$;

an applied voltage to the level shift circuit portion of the second chip is set to be greater than $-V1$ and smaller than $V1$;

an applied voltage to the level shift circuit portion of the third chip is set to be greater than $-2V1$ and smaller than $-V1$;

an applied voltage to the output circuit portion of the first chip is set to be greater than $V1$ and smaller than $2V1$;

an applied voltage to the level shift circuit portion of the second chip is set to be greater than $-V1$ and smaller than $V1$; and an applied voltage to the level shift circuit portion of the third chip is set to be greater than $-2V1$ and smaller than $-V1$.

4. The charged particle beam apparatus according to claim 1, comprising:

a driver integrated circuit that includes the differential input circuit, the level shift circuit, and the output circuit, wherein:

the driver integrated circuit has a multilayer substrate including a plurality of solid layers; and a heat dissipator attached to a rear surface of the multilayer substrate on a side opposite to a chip mounting surface, wherein:

the three or more chips are separately disposed on the chip mounting surface of the multilayer substrate;

a substrate potential is applied to the substrate of each of the three or more chips from a number of the plurality of the solid layers corresponding to the number of the chips;

a plurality of chip potential patterns corresponding to the number of the chips is formed on the rear surface of the multilayer substrate, the chip potential patterns enabling electrical conduction from the solid layers for applying the substrate voltage to each of the three or more chips;

each of the number of solid layers corresponding to the number of the chips to which the substrate voltage is applied, each of the plurality of chip potential patterns, and each of the three or more chips are connected by a plurality of connecting vias such that the chips are electrically isolated from each other; and heat generated from the three or more chips is dissipated outside the driver integrated circuit from the heat dissipator via the plurality of chip potential patterns.

5. The charged particle beam apparatus according to claim 4, comprising an insulating layer of an insulating material disposed between the heat dissipator and the chip potential pattern or the rear surface of the multilayer substrate.

6. A charged particle beam apparatus for measuring a wafer based on secondary electrons generated by irradiating an electron beam to the wafer, the charged particle beam apparatus comprising:

a differential input circuit that amplifies a differential input signal;

a level shift circuit that shifts the voltage of the signal amplified by the differential input circuit; and an output circuit that amplifies and outputs the signal whose voltage is shifted by the level shift circuit;

wherein:

the level shift circuit and the output circuit are divided by using three or more chips;

different voltages are applied to substrates of the three or more chips;

a deviation control of the electron beam is performed with the signal amplified by the output circuit;

the three or more chips include a first chip as a high voltage-applied chip, a second chip as an intermediate voltage-applied chip, and a third chip as a low voltage-applied chip;

an applied voltage to the first chip is set at $V1\pm\delta$ ($V1$ is substantially equal to $V2$; $\delta$ is a variation factor), an applied voltage to the second chip is set at a potential determined by resistive division of the output voltage, and an applied voltage to the third chip is set at $-V1\pm\delta$, where $V2$ is the process withstand voltage; and the output voltage has a maximum value of $\pm 2V1$.

7. A charged particle beam apparatus for measuring a wafer based on secondary electrons generated by irradiating an electron beam to the wafer comprising:

a differential input circuit that amplifies a differential input signal;

a level shift circuit that shifts the voltage of the signal amplified by the differential input circuit;

an output circuit that amplifies and outputs the signal whose voltage is shifted by the level shift circuit; and a substrate potential control unit, wherein:

the level shift circuit and the output circuit are divided by using M chips, including a first chip, a second chip, a third chip, a fourth chip, through an M-th chip, wherein M=2N−1 and N is an integer of at least 3;

an output voltage from the output circuit in the N-th chip has a maximum value of ±NV1;

the substrate potential control unit is configured to set a different applied voltage to each of the M chips, the applied voltage varying in accordance with a value of the output voltage generated by the output circuit from the first chip until the N-th chip, when the output voltage from the output circuit is −NV1, an applied voltage to the i-th chip is set at (N−(2*i−1))V1±δ until i equals N, wherein i is a positive integer;

when the output voltage from the output circuit is NV1, an applied voltage to the (N+j)-th chip is set at (N−(2*j+1))V1±δ until j equals (N−1), wherein j is a positive integer; and a deviation control of the electron beam is performed with the signal amplified by the output circuit; wherein N is three;

the M chips include the first chip, the second chip, the third chip, the fourth chip and a fifth chip;

the output voltage from the output circuit has a maximum value of ±3V1;

when the output voltage from the output circuit is −3V1, an applied voltage to the first chip is set at 2V1±δ, an applied voltage to the second chip is set at 0±δ, and an applied voltage to the third chip is set at −2V1±δ; and when the output voltage from the output circuit is 3V1, an applied voltage to the third chip is set at 2V1±δ, an applied voltage to the fourth chip is set at 0±δ, and an applied voltage to the fifth chip is set at −2V1±δ.

\* \* \* \* \*